United States Patent [19]
Swenson et al.

[11] Patent Number: 5,926,120
[45] Date of Patent: Jul. 20, 1999

[54] MULTI-CHANNEL PARALLEL TO SERIAL AND SERIAL TO PARALLEL CONVERSION USING A RAM ARRAY

[75] Inventors: Erik Rustan Swenson, Campbell; Brian Charles Edem, San Jose, both of Calif.

[73] Assignee: National Semiconductor Corporation, Santa Clara, Calif.

[21] Appl. No.: 08/624,856

[22] Filed: Mar. 28, 1996

[51] Int. Cl.$^6$ .................................................. H03M 9/00
[52] U.S. Cl. ........................................ 341/100; 341/101
[58] Field of Search ...................................... 341/100, 101

[56] References Cited

U.S. PATENT DOCUMENTS

| | | | |
|---|---|---|---|
| 4,023,144 | 5/1977 | Koenig | 340/172.5 |
| 4,079,372 | 3/1978 | Koenig | 340/347 |
| 4,157,458 | 6/1979 | Roche | 179/15 |
| 4,369,504 | 1/1983 | Hanmura | 365/238 |
| 4,393,301 | 7/1983 | Svendsen | 377/56 |
| 4,429,300 | 1/1984 | Yamasawa et al. | 340/347 |
| 4,759,042 | 7/1988 | Humpleman | 377/75 |
| 4,775,990 | 10/1988 | Kamuro et al. | 377/77 |
| 5,005,151 | 4/1991 | Kurkowski | 364/900 |
| 5,030,951 | 7/1991 | Eda et al. | 341/100 |
| 5,055,717 | 10/1991 | Naito et al. | 307/463 |
| 5,055,842 | 10/1991 | Mueller | 341/100 |
| 5,175,819 | 12/1992 | Le Ngoc et al. | 395/250 |
| 5,337,050 | 8/1994 | Sugawara | 341/100 |
| 5,463,630 | 10/1995 | Tooher | 370/112 |
| 5,563,594 | 10/1996 | Ford et al. | 341/100 |
| 5,598,156 | 1/1997 | Hush et al. | 341/100 |

*Primary Examiner*—Jeffrey A. Gaffin
*Assistant Examiner*—Jason H. Vick
*Attorney, Agent, or Firm*—Eugene Conser

[57] ABSTRACT

A circuit to implement a multi-channel parallel to serial conversion and a multi-channel serial to parallel conversion in one minimal RAM Matrix. The number of RAM cells (bits) needed is equivalent to the number of Flip-Flops used in a standard shift register and holding register implementation.

8 Claims, 9 Drawing Sheets

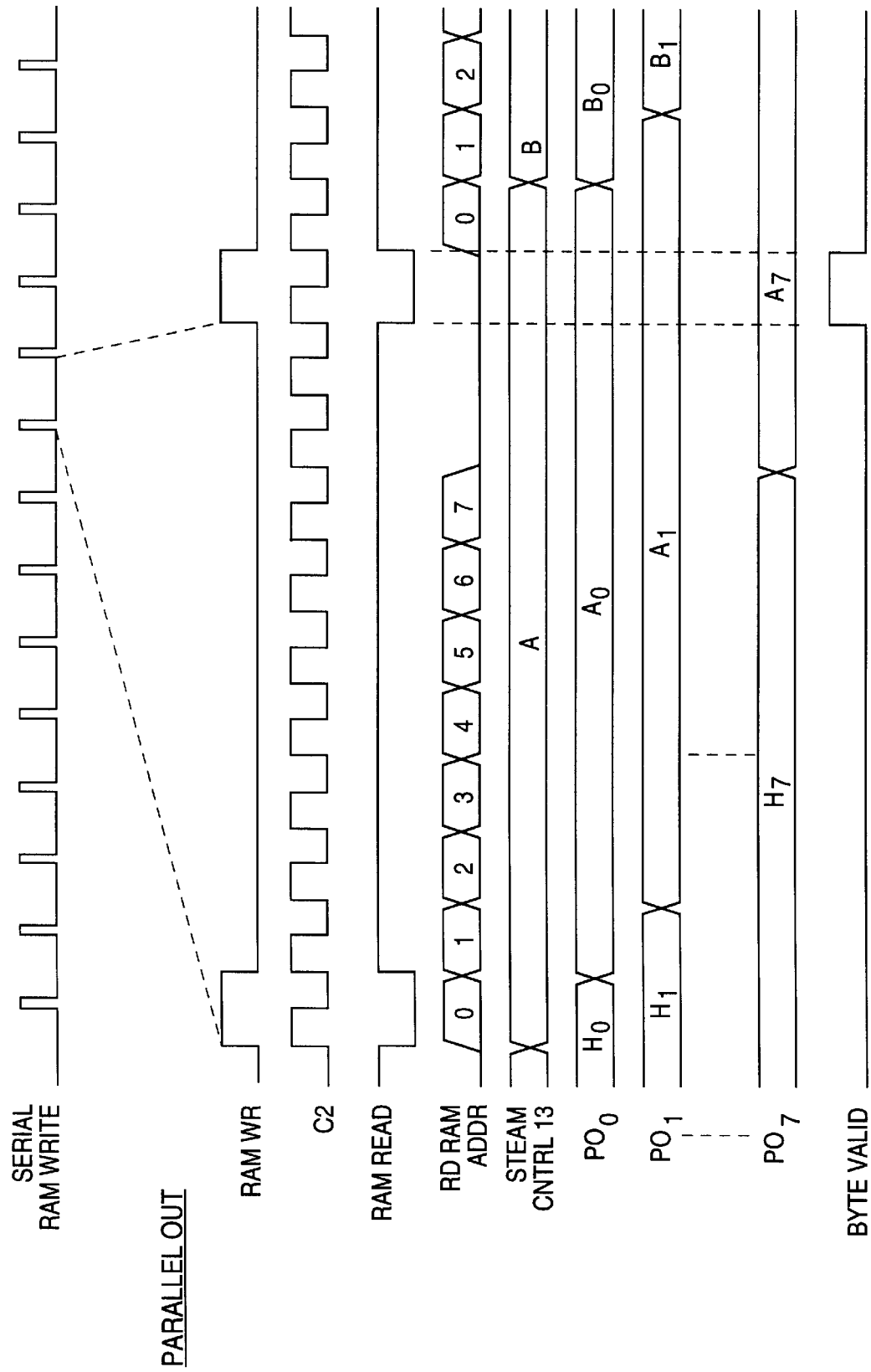

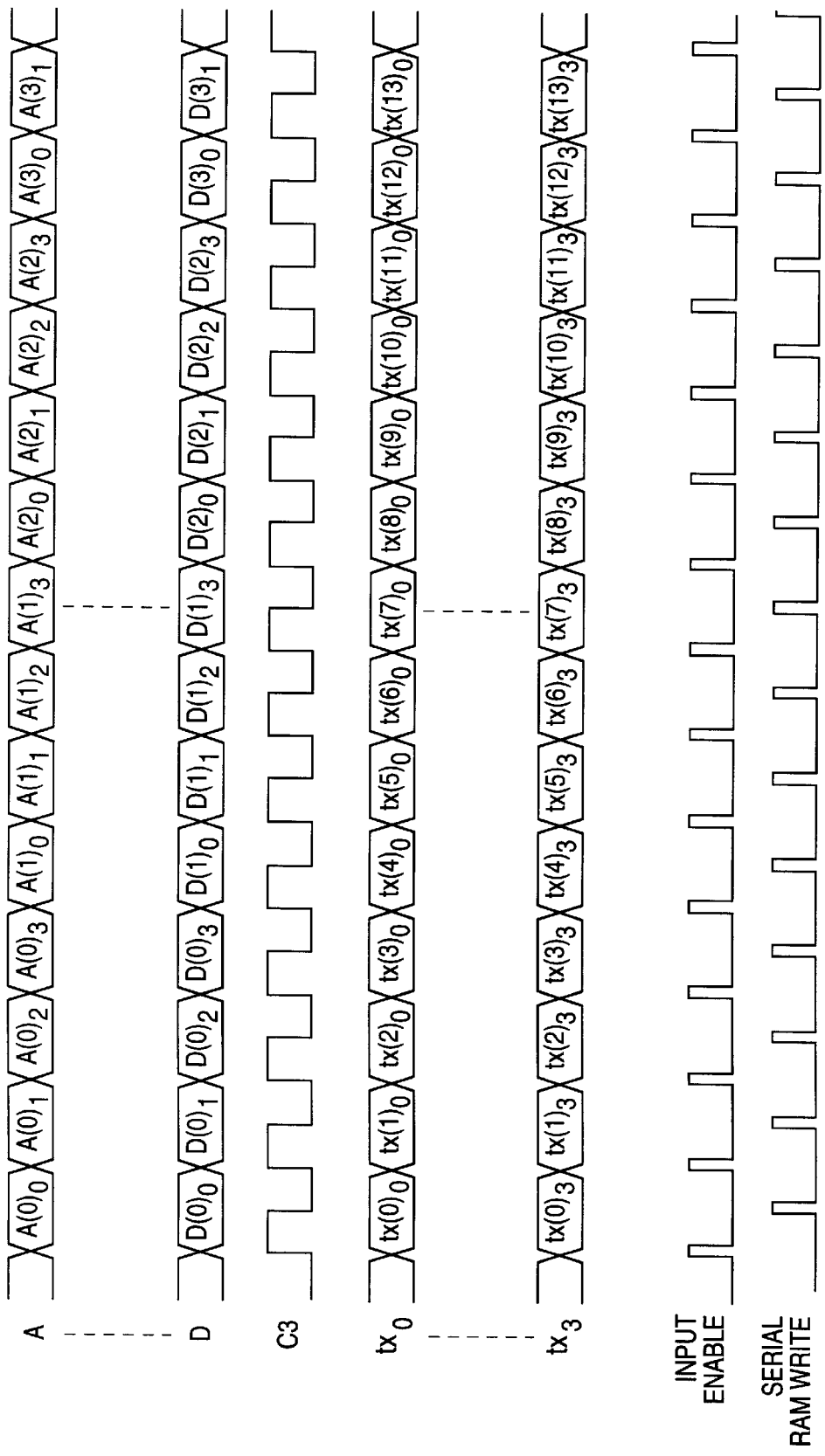

MULTI-CHANNEL PARALLEL TO SERIAL AND SERIAL TO PARALLEL CONVERSION USING A RAM ARRAY

TECHNICAL FIELD OF INVENTION

This invention relates to signal converters which can convert serial input data of a predetermined length into a parallel output signal and parallel input data of a predetermined width into a serial output signal.

DESCRIPTION OF RELATED ART

It is well known to use a shift register to convert data from serial to parallel form as well as parallel to serial form.

When data is converted from serial to parallel form, a serially input signal is stored in a shift register through successive shifting of the input signal. When the signal of a predetermined length has been stored in the shift register, the whole stored contents are transferred at one time to a buffer register having bit positions corresponding to those of the shift register. The contents thus placed in the buffer register constitute a parallel output signal converted from the serial input signal.

Similarly, when data is converted from parallel to serial form, a parallel input signal is stored in a buffer register. The whole stored contents of the buffer register are transferred at one time to a shift register having bit positions corresponding to those of the buffer register. When the signal has been stored in the shift register, the whole stored contents of the shift register are transferred out through successive shifting of the shift register. The contents thus shifted out of the shift register constitute a serially output signal converted from the parallel input signal.

The problem with converters implemented with shift registers is that implementation of the converter requires a large number of transistors, which in turn requires a large area on an Integrated Circuit.

Accordingly it would be desirable to provide a converter with a lower transistor count thus reducing the area consumption on an Integrated Circuit.

SUMMARY OF THE INVENTION

This invention overcomes the above problem and provides a convenient and economical method of reducing area consumption.

A serial to parallel and parallel to serial converter, in accordance with one embodiment of the invention, includes a first set of n registers, a second set of m registers, a Random Access Memory (RAM) array, a first Multiplexer (MUX), a second MUX, a first shift register, m hold registers and a second shift register. The first set of n registers each have an input, an output and a clock terminal, wherein inputs are for receiving serial data streams. The second set of m registers each have an input, an output, an enable and a clock terminal, wherein inputs are for receiving parallel data streams. The RAM array has (n+m) inputs, connected to the outputs of the first set of n registers and the outputs of the second set of the m registers, and (n+m) outputs. The second (MUX) has m inputs, an output and a control terminal, wherein the m inputs of the second MUX are connected to the m outputs of the RAM. The first MUX has n inputs, an output and a control terminal, wherein the n inputs of the first MUX are connected to the n outputs of the RAM. The first shift register has m outputs, an input and a clock terminal wherein the input of the first shift register is connected to the output of the second MUX and the clock terminal is connected to the clock terminals of the second set of m registers. The m hold registers each have an input, an output and a clock terminal wherein the clocks of the m hold registers are connected to the clock terminals of the first set of n registers, and each output of the first shift register is connected to one of the inputs of the m hold registers. The second shift register has n outputs, an input and a clock terminal wherein the clock terminal of the second shift register is connected to the clock terminal of the first shift register and the input of the second shift register is connected to the output of the first MUX, and further wherein the outputs of the second shift register provide parallel output data streams corresponding to the serial data streams received by the inputs of the first set of n registers and the outputs of the m hold registers provide serial output data streams corresponding to the parallel data streams received by the inputs of the second set of m registers.

A serial to parallel converter, in accordance with another embodiment of the invention, includes a set of n registers, a Random Access Memory (RAM) array, a Multiplexer (MUX) and a shift register. The set of n registers each have an input, an output and a clock terminal, wherein inputs are for receiving serial data streams. The RAM array has n inputs, connected to the outputs of the set of n registers, and m outputs. The MUX has m inputs, an output and a control terminal, wherein the m inputs of the MUX are connected to the m outputs of the RAM. The shift register has m outputs, an input and a clock terminal wherein the input of the shift register is connected to the output of the MUX, and further wherein the outputs of the shift register provide parallel output data streams corresponding to the serial data streams received by the inputs of the set of n registers.

A parallel to serial converter, in accordance with still another embodiment of the invention, includes a set of n registers, a Random Access Memory (RAM) array, a Multiplexer (MUX), a shift register and m hold registers. The set of n registers each have an input, an output and a clock terminal, wherein inputs are for receiving parallel data streams. The RAM array has n inputs, connected to the outputs of the set of n registers, and m outputs. The MUX has m inputs, an output and a control terminal, wherein the m inputs of the MUX are connected to the m outputs of the RAM. The shift register has m outputs, an input and a clock terminal wherein the clock terminal of the shift register is connected to the clock terminals of the set of n registers and the input of the shift register is connected to the output of the MUX. The m hold registers each have an input, an output and a clock terminal wherein each output of the shift register is connected to one of the inputs of the m hold registers. The outputs of the m hold registers provide serial output data streams corresponding to the parallel data streams received by the inputs of the set of n registers.

DETAILED DESCRIPTION

Figure 1:
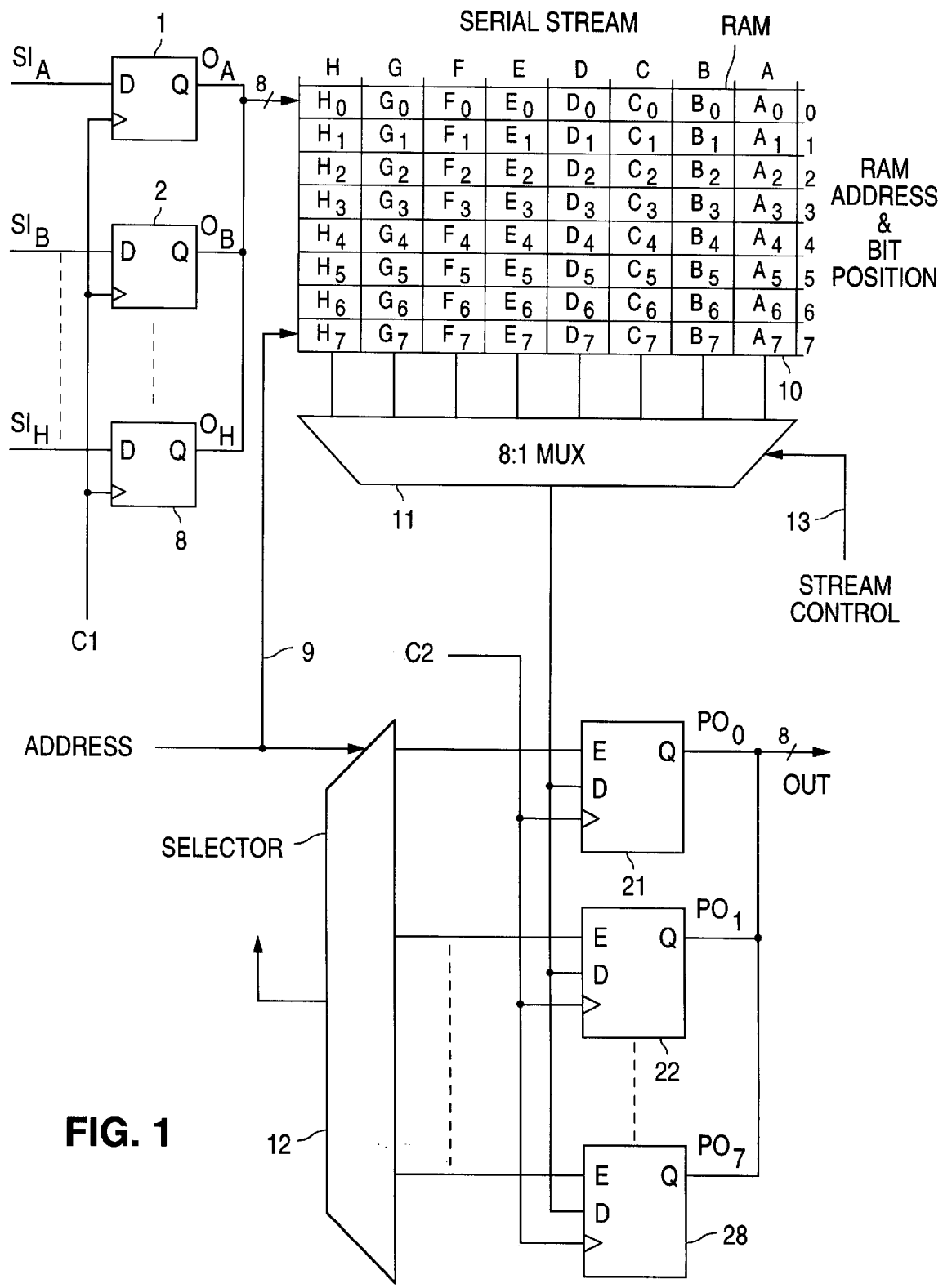
FIG. 1 is a logic diagram of eight serial-to-parallel converter circuits in accordance with one embodiment of the present invention.

Referring to FIG. 1, a serial-to-parallel converter in accordance with one embodiment of the present invention includes a first set of eight registers 1–8, a RAM 10, a MUX 11, a selector 12 and a second set of eight registers 21–28. The first set of eight registers 1–8 receives eight streams of serial data, eight bits long, one stream for each register, and transmits the data to the RAM 10 in parallel form, one bit from each register 1–8 for each applied clock pulse C1. The RAM 10 receives the parallel data and stores it in the RAM 10 at locations determined by an address signal 9 provided along with the clock C1 sequence. When all 8 bits of each serial stream have been stored in the RAM 10, the MUX 11 begins to read the information stored in the RAM 10 and transmits it to the second set of eight registers 21–28, one register at a time as determined by the selector 12, clock C2 and stream control 13. Both the RAM 10 read/write activity and the selection of registers 21–28 are controlled by an address signal 9. When all eight bits of the second set of eight registers 21–28 have been loaded, the eight outputs of the second set of eight registers 21–28 are then valid.

Figure 2A:
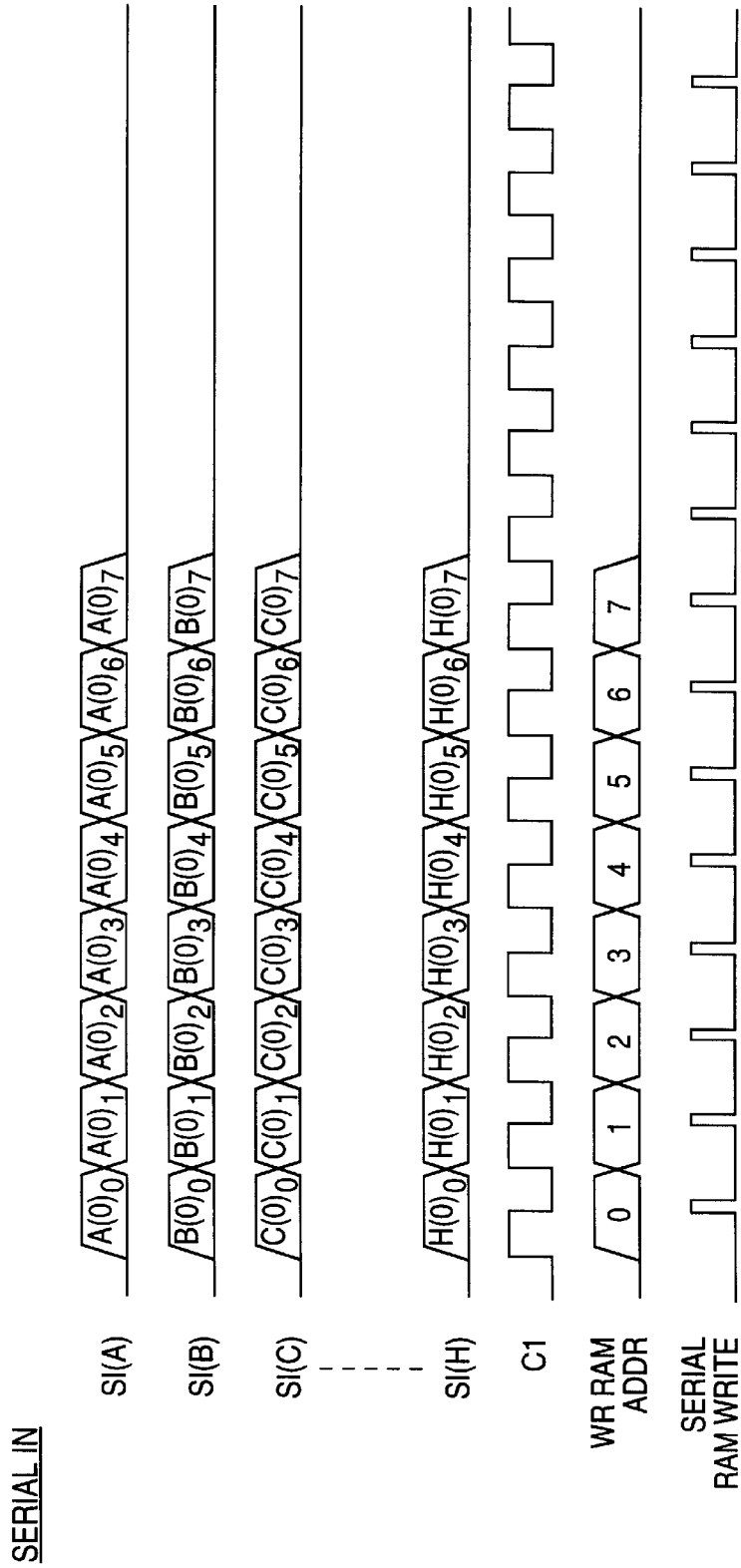
FIG. 2 is a timing diagram for the converter circuit of FIG. 1.

Referring to FIGS. 1 and 2, the serial-to-parallel conversion operates as follows. Eight serial streams of data, eight bits per stream, are applied to the inputs of the first set of eight registers 1–8, one stream per each input. The clock C1 is synchronized with the serial data streams, which are in turn synchronized with each other, and is applied to each of the clock inputs of the first set of eight registers 1–8. The application of the first pulse of clock C1 transfers the least significant bit (LSB) of each serial data stream to the outputs of the first set of eight registers 1–8. An initial address 9 is provided along with the first clock pulse of C1 and is applied to the RAM 10, wherein the eight LSB's of the serial data streams are loaded into the corresponding address within the RAM 10. The application of the second clock pulse of C1 transfers the next most significant bits of each serial data stream to the outputs of the first set of eight registers 1–8. Another address 9 is provided along with the second clock pulse of C1 and is applied to the RAM 10, wherein the eight next most significant bits of the serial data streams are loaded into the RAM 10 at such address therein. The application of clock pulses C1 continues in a similar manner until all eight bits of each serial data stream have been loaded into the RAM 10.

After all eight bits of each serial data stream have been loaded into the RAM 10 then the parallel output sequence begins. An initial address signal 9 is provided along with the first clock pulse of C2 and is applied to the RAM 10. At the same time, a stream control signal 13 is applied to the MUX 11, selecting the data stored in the RAM 10 from the first serial data stream. In addition, the address 9 is applied to the selector 12, thus enabling the register 21 of the second set of registers 21–28. The first clock pulse of C2 is also applied to register 21 thus loading the LSB of the first serial data stream from the RAM 10 into register 21. The application of a second clock pulse C2 transfers the next most significant bit of the first serial data stream to the register 22. The application of clock pulses C2 continues in a similar manner until all eight bits of the first serial data stream have been loaded into the second set of eight registers 21–28. When all eight registers 21–28 are loaded, the serial-to-parallel conversion of the first serial data stream is complete. In practice, all RAM 10 write operations are to a row of the RAM 10 array and all RAM 10 read operations are from a column of the RAM 10 array.

In a similar manner, the stream control signal 13 changes to select the second serial data stream and the process is repeated until the serial-to-parallel conversion of the second serial data stream is complete.

The stream control signal 13 is sequentially changed until all eight serial data streams have been converted to a parallel form.

Figure 3:
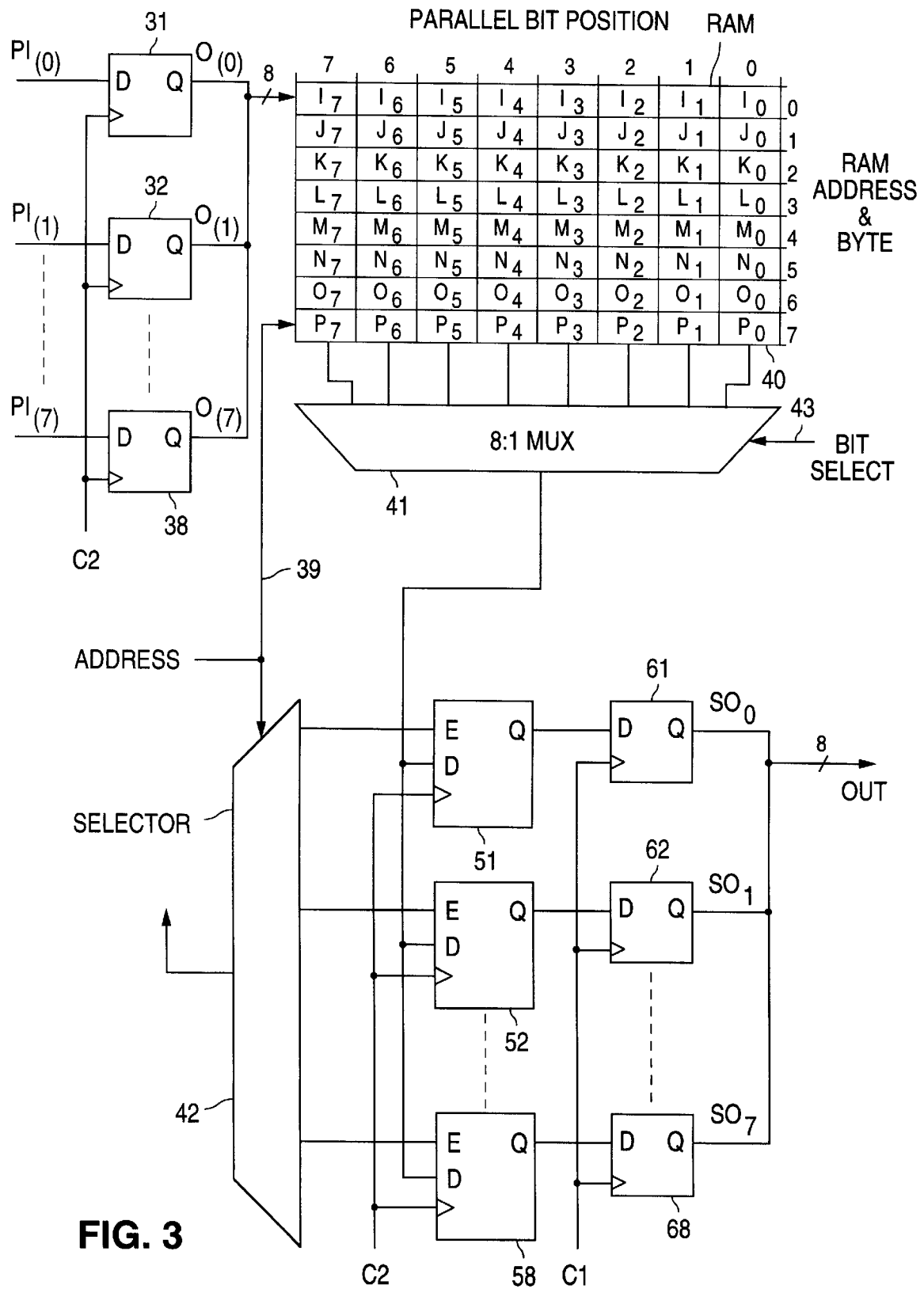
FIG. 3 is a logic diagram of eight parallel-to-serial converter circuits in accordance with another embodiment of the present invention.

Referring to FIG. 3, a parallel-to-serial converter in accordance with another embodiment of the present invention includes a first set of eight registers 31–38, a RAM 40, a MUX 41, a selector 42 a second set of eight registers 51–58 and a third set of eight registers 61–68. The first set of eight registers 31–38 receives streams of parallel data, eight bits wide, one bit for each register, and transmits the data to the RAM 40 in parallel form, one bit from each register 31–38 for each applied clock pulse C2. The RAM 40 receives the parallel data and stores it in the RAM 40 at locations determined by an address 39. When all 8 bits of each of 8 parallel bytes have been stored in the RAM 40, the MUX 41 begins to read the information stored in the RAM 40 and transmits it to the second set of eight registers 51–58, one register at a time as determined by the selector 42 and clock C2. Both the RAM 40 read/write activity and the second MUX 42 register selection are controlled by the address signal 39. When all eight bits of the second set of eight registers 51–58 have been loaded, the eight outputs of the second set of eight registers 51–58 are then valid. The data stored in the second set of eight registers 51–58 is then transferred to the third set of eight registers 61–68 by clock C1.

Figure 4:
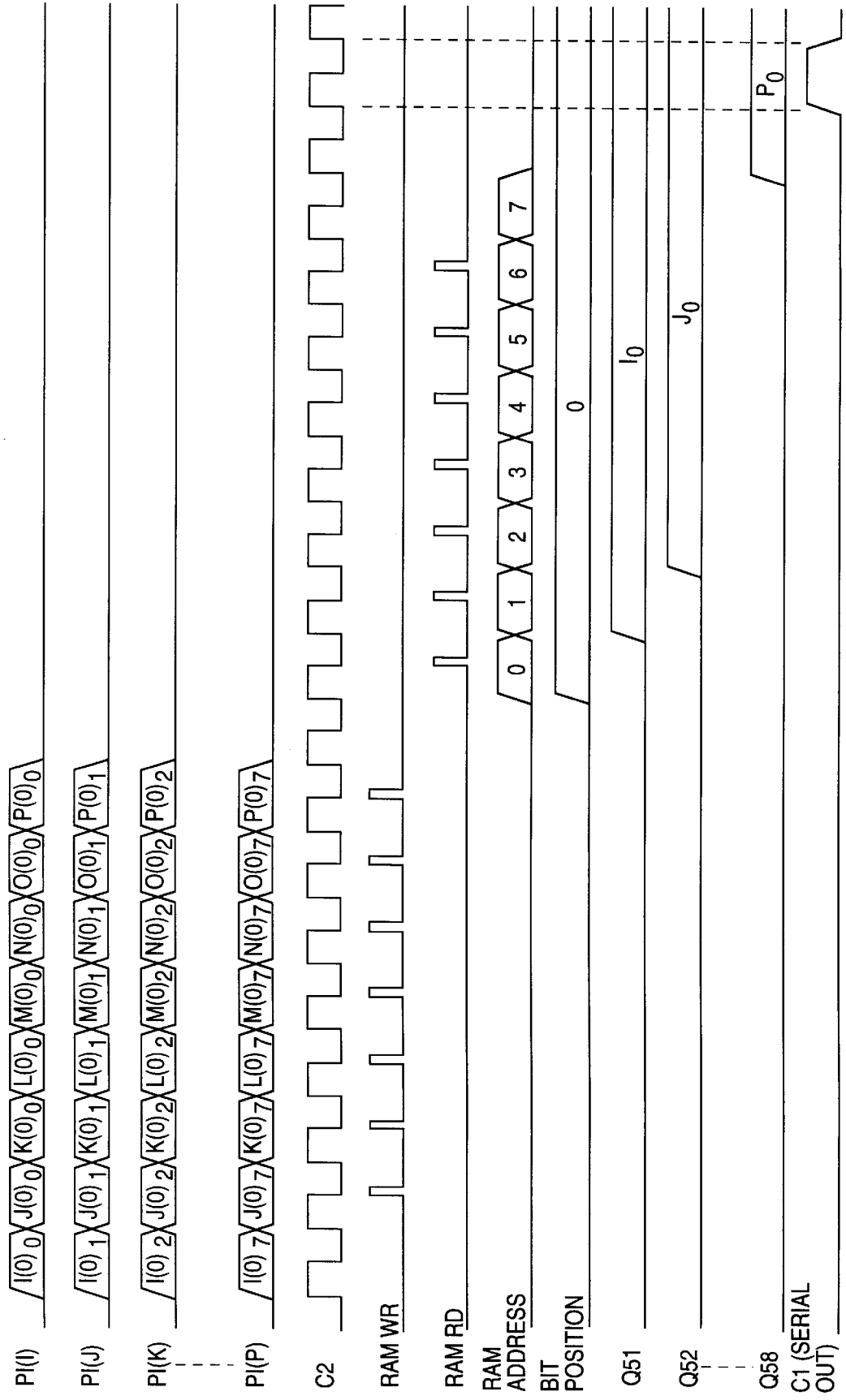
FIG. 4 is a timing diagram for the converter circuit of FIG. 3.

Referring to FIGS. 3 and 4, the parallel-to-serial conversion operates as follows. A first set of eight parallel bits of data is applied to the inputs of the first set of eight registers 31–38, one bit per each input. The clock C2 is synchronized with the parallel data and is applied to each of the clock inputs of the first set of eight registers 31–38. The application of the first clock pulse of C2 transfers the first eight bits of parallel data to the outputs of the first set of eight registers 31–38. An initial address 39 is provided along with the first clock pulse of C2 and is applied to the RAM 40, wherein the first eight bits of parallel data are loaded into the RAM 40 at the address 39 provided with the first clock pulse of C2. A second set of eight bits of parallel data is then applied to the first set of eight registers 31–38 and the second clock pulse of C2 transfers the second set of eight bits of parallel data to the outputs of the first set of eight registers 31–38. Another address 39 is provided along with the second clock pulse of C2 and is applied to the RAM 40, wherein the second set of eight bits of parallel data is loaded into the RAM 40 at the address 39 provided with the second clock pulse of C2. The application of clock pulses C2 continues in a similar manner until eight sets of eight bits of parallel data bits have been loaded into the RAM 40.

After all eight sets of parallel data have been loaded into the RAM 40 then the serial output sequence begins. An initial address 39 is provided along with the first clock pulse of C2 and the address is applied to the RAM 40. At the same time, a bit select signal 43 is applied to the MUX 41, selecting the data stored in the RAM 40 from the first set of parallel data. In addition, the address 39 provided with the first clock pulse of C2 is applied to the selector 42, thus enabling the first register 51 of the second set of registers 51–58. The first clock pulse of C2 is also applied to the first register 51 thus loading the LSB of the first set of parallel data into the first register 51. The application of a second clock pulse C2 transfers the LSB of the second set of parallel data to the second register 52. The application of clock pulses C2 continues in a similar manner until all the eight LSB's of the eight parallel data sets have been loaded into the second set of eight registers 51–58. When all eight registers 51–58 are loaded, the parallel-to-serial conversion of all the LSB's of the eight parallel data sets is complete. In practice, all RAM 40 write operations are to a row of the RAM 40 array and all RAM 40 read operations are from a column of the RAM 40 array.

The data stored in the second set of eight registers 51–58 is then transferred to the third set of eight registers 61–68 by clock C1.

In a similar manner, the bit select signal 43 is changed to select the next more significant bit of each of the eight parallel data sets and the process is repeated until the parallel-to-serial conversion of the next more significant bit of each of the eight parallel data sets is complete.

The bit select signal 43 of MUX 41 is sequentially changed until all eight parallel data sets have been converted to a serial form.

Figure 5A:
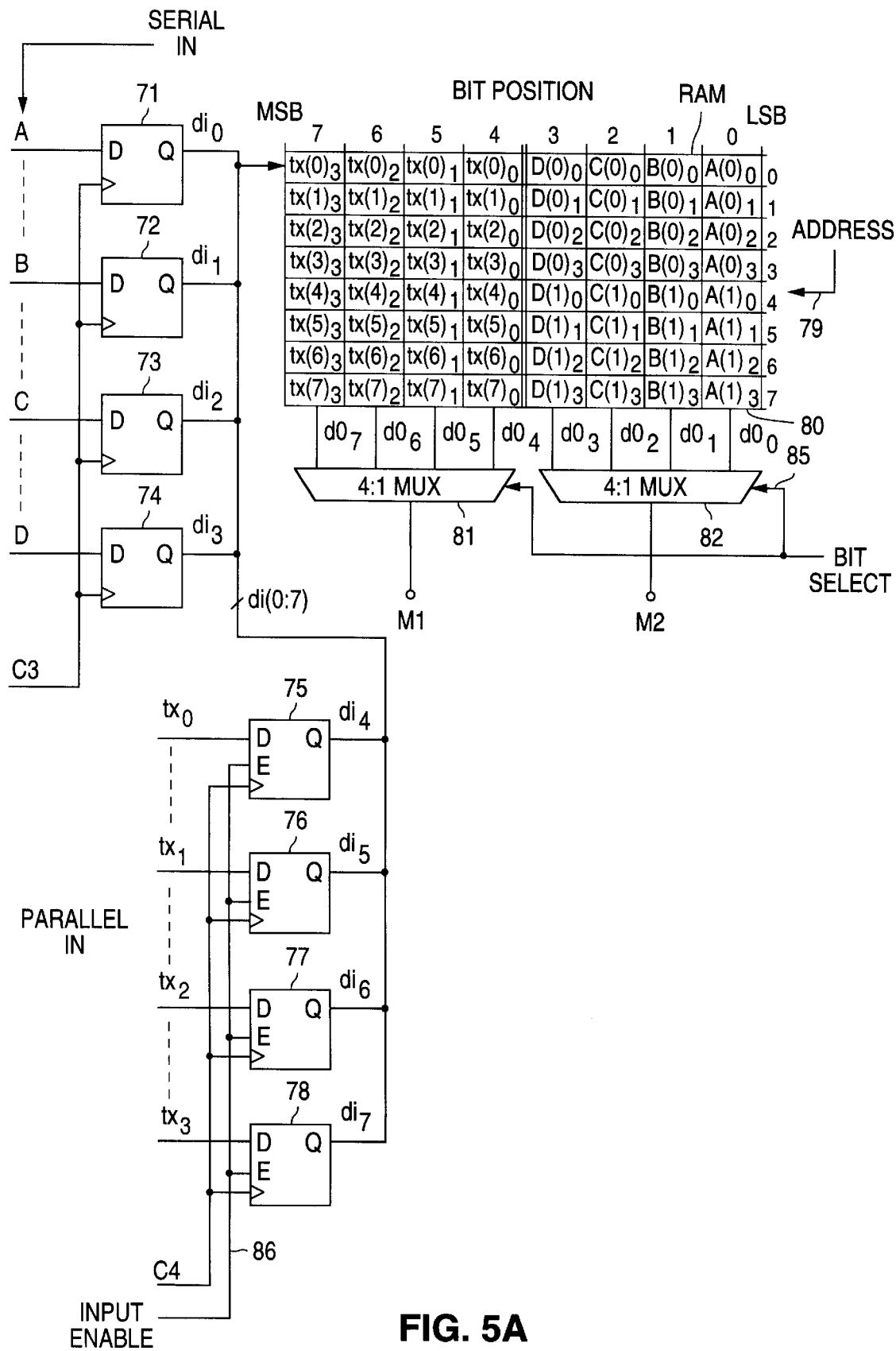
FIG. 5 is a logic diagram of a four bit parallel-to-serial and four bit serial-to-parallel converter circuit in accordance with still another embodiment of the present invention.
Figure 5B:
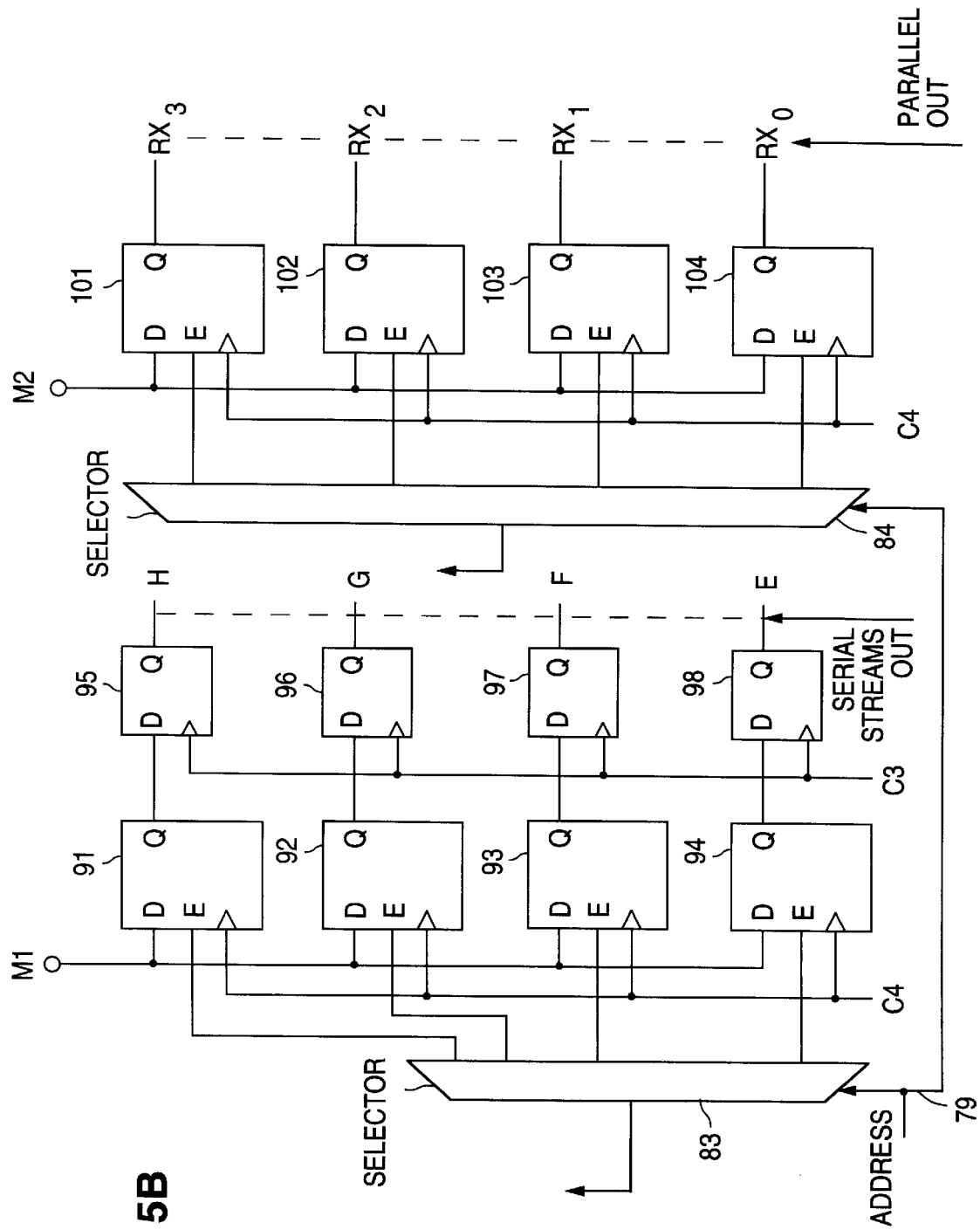

Referring to FIG. 5, a parallel-to-serial and serial-to-parallel converter in accordance with still another embodiment of the present invention includes a first set of four registers 71–74, a second set of four registers 75–78, a RAM 80, a first MUX 82, a second MUX 81, a first selector 83, a second selector 84, a third set of four registers 91–94, a fourth set of four registers 95–98 and a fifth set of four registers 101–104. The first set of four registers 71–74 receives streams of serial data one stream for each register, and transmits the data to the RAM 80, one bit from each register 71–74 for each applied clock pulse C3. The RAM 80 receives the data and stores it in the RAM 80 at locations determined by an address signal 79 and the clock signal C3 sequence.

Similarly, the second set of four registers 75–78 receives streams of parallel data one bit for each register, and transmits the data to the RAM 80, one bit from each register 75–78 for each applied clock pulse C4. The RAM 80 receives the data and stores it in the RAM 80 at locations determined by the address signal 79 and clock signal C4 sequence.

When all four bits of each serial stream and all four nibbles of the parallel stream have been stored in the RAM 80, the second MUX 81 selects the information stored in the RAM 80 and transmits it to the third set of four registers 91–94, one register at a time as determined by the first selector 83 and clock C4. The RAM 80 read/write activity and the first selector 83 register selection are controlled by the address signal 79, and the second MUX 81 bit selection is controlled by the bit select signal 85. When all four bits of the third set of four registers 91–94 have been loaded, the four outputs of the third set of four registers 91–94 are then transferred to the fourth set of four registers 95–98, one output for each register of the fourth set of four registers 95–98, by clock C3. Simultaneously the first MUX 82 selects the information stored in the RAM 80 and transmits it to the fifth set of four registers 101–104, one register at a time as determined by the second selector 84 and clock C4. The RAM 80 read/write activity and the second selector 84 register selection is controlled by the address signal 79, and the first MUX 82 bit selection is controlled by the bit select signal 85. When all four bits of the fifth set of four registers 101–104 have been loaded, the four outputs of the fifth set of four registers 101–104 are then valid.

In practice, a user of the parallel-to-serial and serial-to-parallel converter would want to read data from the outputs of the fourth set of four registers 95–98 and fifth set of four registers 101–104 while simultaneously entering data into the first set of four registers 71–74 and the second set of four registers 75–78. When a set of four bits from each of four serial streams and four nibbles of a parallel stream have been stored in the RAM 80, the data in the RAM 80 is defined as valid data. If the RAM 80 array is organized such that there are only sufficient memory locations for the set of four bits from each of four serial streams and four nibbles of a parallel stream then the next set of data written by the next series of C3 clocks will over-write the previous set of valid data in the RAM 80. In order to prevent over-writing of the valid data, sufficient memory locations must be provided in the RAM 80 array to simultaneously hold at least two sets of four bits from each of four serial streams and four nibbles of a parallel stream. A memory which can hold at least two sets of data is said to be Double Buffered.

Figure 6B:
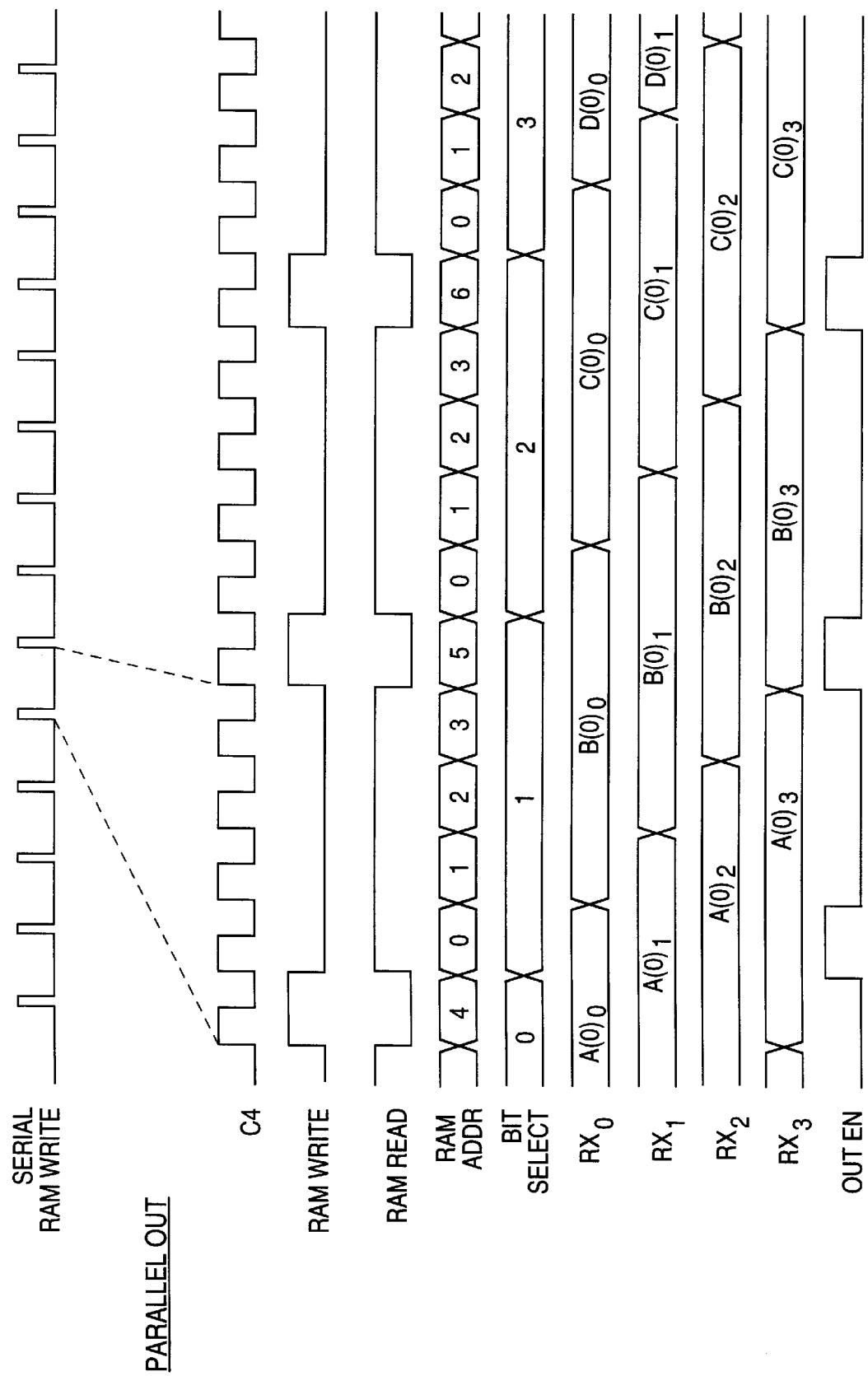
FIG. 6 is a timing diagram for the converter circuit of FIG. 5.

Referring to FIGS. 5 and 6, the parallel-to-serial conversion operates as follows. A first set of 4 parallel bits of data is applied to the inputs of the second set of four registers 75–78, one bit per each input. The clock C4 is synchronized with the parallel data and is applied to each of the clock inputs of the second set of four registers 75–78. Simultaneously an input enable signal 86 is applied to each of the enable inputs of the second set of four registers 75–78. The application of the first clock pulse of C4 and the input enable signal 86 transfers the first four bits of parallel data to the outputs of the second set of four registers 75–78. An address signal 79 is provided along with the first clock pulse of C4 and is applied to the RAM 80, wherein the first four bits of parallel data are loaded into the RAM 80 at the address 79 provided with the first clock pulse of C4. A second set of four bits of parallel data is then applied to the second set of four registers 75–78 and the second clock pulse of C4 and the input enable signal 86 transfers the second set of four bits of parallel data to the outputs of the second set of four registers 75–78. The address signal 79 is provided along with the second clock pulse of C4 and is applied to the RAM 80, wherein the second set of four bits of parallel data is loaded into the RAM 80 at the address provided with the second clock pulse of C4. The application of clock pulses C4 continues in a similar manner until four sets of four bits of parallel data bits have been loaded into the RAM 80.

After all four sets of parallel data have been loaded into the RAM 80 then the serial output sequence begins. An initial address signal 79 is provided along with the first clock pulse of C4 and is applied to the RAM 80. At the same time, a bit select signal 85 is applied to the second MUX 81, selecting the data stored in the RAM 80 from the first parallel set of data. In addition, the address signal 79 provided with first clock pulse of C4 is applied to the first selector 83, thus enabling the first register 91 of the third set of four registers 91–94. The first clock pulse of C4 is also applied to the first register 91 thus loading the LSB of the first set of parallel data into the first register 91. The application of a second clock pulse C4 transfers the LSB of the second set of parallel data to the second register 92. The application of clock pulses C4 continues in a similar manner until all the 4 LSB's of the 4 parallel data sets have been loaded into the third set of four registers 91–94. When all four registers 91–94 are loaded, the parallel-to-serial conversion of all the LSB's of the four parallel data sets is complete.

The data stored in the third set of four registers 91–94 is then transferred to the fourth set of four registers 95–98 by clock C3.

In a similar manner, the bit select signal 85 is changed to select the next most significant bit of each of the four parallel data sets and the process is repeated until the parallel-to-serial conversion of the next most significant bit of each of the four parallel data sets is complete.

The bit select signal 85 of second MUX 81 is sequentially changed until all four parallel data sets have been converted to a serial form.

Referring to FIGS. 5 and 6, the serial-to-parallel conversion operates as follows. Four serial streams of data, four bits per stream, are applied to the inputs of the first set of four registers 71–74, one stream per each input. The clock C3 is synchronized with the serial data streams, which are in turn synchronized with each other, and is applied to each of the clock inputs of the first set of four registers 71–74. The application of the first clock pulse of C3 transfers the least significant bit (LSB) of each serial data stream to the outputs of the first set of four registers 71–74. An initial address signal 79 is provided along with the first clock pulse of C3 and is applied to the RAM 80, wherein the four LSB's of the serial data streams are loaded into the RAM 80 at the address provided with the first clock pulse of C3. The application of the second clock pulse of C3 transfers the next most significant bits of each serial data stream to the outputs of the first set of four registers 71–74. Another address signal 79 is provided along with the second clock pulse of C3 and is applied to the RAM 80, wherein the four next most significant bits of the serial data streams are loaded into the RAM 80 at the address provided with the second clock pulse of C3. The application of clock pulses C3 continues in a similar manner until all four bits of each serial data stream have been loaded into the RAM 80.

After all four bits of each serial data stream have been loaded into the RAM 80 then the parallel output sequence begins. An initial address signal 79 is provided along with the first clock pulse of C4 and is applied to the RAM 80. At the same time, a bit select signal 85 is applied to the first MUX 82, selecting the data stored in the RAM 80 from the first serial data stream. In addition, the address signal 79 is applied to the second selector 84, thus enabling the first register 101 of the fifth set of four registers 101–104. The first clock pulse of C4 is also applied to the first register 101 thus loading the LSB of the first serial data stream into the first register 101. The application of a second clock pulse C4 transfers the next most significant bit of the first serial data stream to the second register 102. The application of clock pulses C4 continues in a similar manner until all four bits of the first serial data stream have been loaded into the fifth set of four registers 101–104. When all four registers 101–104 are loaded, the serial-to-parallel conversion of the first serial data stream is complete. In practice, all RAM 80 write operations are to a row of the RAM 80 array and all RAM 80 read operations are from a column of the RAM 80 array.

In a similar manner, the bit select signal 85 is changed to select the second serial data stream and the process is repeated until the serial-to-parallel conversion of the second serial data stream is complete.

The bit select signal 85 is sequentially changed until all four serial data streams have been converted to a parallel form.

In practice, the number of RAM cell (bits) needed in a RAM array implementation is equivalent to the number of Flip-Flops used in a standard shift register and holding register implementation of a converter. In a typical design, a RAM cell requires six transistors per cell and a Flip-Flop requires twenty transistors per Flip-Flop. By transistor count alone, a RAM array implementation results in an area saving of over sixty percent. In addition, the RAM cell layouts are usually "hand packed" and the Flip-Flops are "auto-routed" offering additional area savings.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A selectable serial to parallel and parallel to serial converter circuit comprising:

a first set of n registers each having an input, an output and a clock terminal, wherein said inputs are for receiving serial data streams;

a second set of m registers each having an input, an output, an enable and a clock terminal, wherein said inputs are for receiving parallel data streams;

a RAM array having (n+m) inputs, connected to said outputs of said first set of n registers and said outputs of said second set of said m registers, and (n+m) outputs;

a first MUX having n inputs, an output and a control terminal, wherein said n inputs of said first MUX are connected to n outputs of said RAM;

a second MUX having m inputs, an output and a control terminal, wherein said m inputs of said second MUX are connected to m outputs of said RAM;

a first shift register having m outputs, an input and a clock terminal, wherein said input of said first shift register is connected to said output of said second MUX and said clock terminal of said first shift register is connected to said clock terminals of said second set of m registers;

a set of m hold registers each having an input, an output and a clock terminal, wherein said clock terminals of said m hold registers are connected to said clock terminals of said first set of n registers and each output of said first shift register is connected to one of said inputs of said m hold registers; and a second shift register having n outputs, an input and a clock terminal, wherein said clock terminal of said second shift register is connected to said clock terminal of said first shift register and said input of said second shift register is connected to said output of said first MUX, and further wherein said outputs of said second shift register provide parallel output data streams corresponding to said serial data streams received by said inputs of said first set of n registers and said outputs of said set of m hold registers provide serial output data streams corresponding to said parallel data streams received by said inputs of said second set of m registers.

2. The selectable serial to parallel and parallel to serial converter circuit of claim 1, wherein said first shift register further includes:

a third set of m registers each having an input, an output, an enable and a clock terminal, wherein all the clock terminals of said third set of m registers are connected together and all inputs of said third set of m registers are connected together; and a first selector having an input, m outputs and a control terminal, wherein each output of said first selector is connected to one of said enables of said third set of m registers.

3. The selectable serial to parallel and parallel to serial converter circuit of claim 1, wherein said second shift register further includes:

a fourth set of n registers each having an input, an output, an enable and a clock terminal, wherein all the clock terminals of said fourth set of n registers are connected together and all inputs of said fourth set of n registers are connected together; and a second selector having an input, n outputs and a -control terminal, wherein each output of said second selector is connected to one of said enables of said fourth set of n registers.

4. The selectable serial to parallel and parallel to serial converter circuit of claim 1, wherein said RAM is Double Buffered.

5. A serial to parallel converter circuit comprising:

a set of n registers each having an input, an output and a clock terminal, wherein said inputs are for receiving serial data streams;

a RAM array having n inputs, connected to said outputs of said set of n registers, and n outputs;

a MUX having n inputs, an output and a control terminal, wherein said n inputs of said MUX are connected to said n outputs of said RAM; and a shift register having m outputs, an input and a clock terminal wherein said input of said shift register is connected to said output of said MUX, and further wherein said outputs of said shift register provide parallel output data streams corresponding to said serial data streams received by said inputs of said set of n registers.

6. The serial to parallel converter circuit of claim 5, wherein said shift register further includes:

a second set of m registers each having an input, an output, an enable and a clock terminal, wherein all the clock terminals of said second set of m registers are connected together and all inputs of said set of m registers are connected together; and a selector having an input, m outputs and a control terminal, wherein each output of said selector is connected to one of said enables of said second set of m registers.

7. A parallel to serial converter circuit comprising:

a set of m registers each having an input, an output and a clock terminal, wherein said inputs are for receiving parallel data streams;

a RAM array having m inputs, connected to said outputs of said set of m registers, and m outputs;

a MUX having m inputs, an output and a control terminal, wherein said m inputs of said MUX are connected to said m outputs of said RAM;

a shift register having n outputs, an input and a clock terminal wherein said clock terminal of said shift register is connected to said clock terminals of said set of m registers and said input of said shift register is connected to said output of said MUX; and a set of n hold registers each having an input, an output and a clock terminal wherein each output of said shift register is connected to one of said inputs of said hold registers, and further wherein said outputs of said n hold registers provide serial output data streams corresponding to said parallel data streams received by said inputs of said set of m registers.

8. The parallel to serial converter circuit of claim 7, wherein said shift register further includes:

a second set of m registers each having an input, an output, an enable and a clock terminal, wherein all the clock terminals of said second set of m registers are connected together and all inputs of said set of m registers are connected together; and a selector having an input, m outputs and a control terminal, wherein each output of said selector is connected to one of said enables of said second set of m registers.

* * * * *